United States Patent [19]
Morimoto

[11] Patent Number: 5,902,995
[45] Date of Patent: May 11, 1999

[54] CCD IMAGE SENSOR WITH OVERFLOW BARRIER FOR DISCHARGING EXCESS ELECTRONS AT HIGH SPEED

[75] Inventor: Michihiro Morimoto, Tokyo, Japan

[73] Assignee: NEC Corporation, Tokyo, Japan

[21] Appl. No.: 08/901,458

[22] Filed: Jul. 28, 1997

[30] Foreign Application Priority Data

Jul. 30, 1996 [JP] Japan ................................. 8-200723

[51] Int. Cl.$^6$ .................................................. H01J 40/14
[52] U.S. Cl. ...................................... 250/208.1; 348/314
[58] Field of Search ........................ 250/208.1; 257/233, 257/232, 222, 223; 348/314, 311

[56] References Cited

U.S. PATENT DOCUMENTS 4,977,584  12/1990  Kohno et al. ........................... 257/223

FOREIGN PATENT DOCUMENTS 62-154881   7/1987   Japan .
63-254767  10/1988   Japan .

OTHER PUBLICATIONS

Morimoto et al; "A 2/3 inch 2M-Pixel IT-CCD Image Sensor with Individual p-Wells for Separate V-CCD and H-CCD Formation"; Jan. 1994; pp. 222-223; IEEE International Solid-State Circuits Conference.

Primary Examiner—Que T. Le
Attorney, Agent, or Firm—Hayes, Soloway, Hennessey, Grossman & Hage, P.C.

[57] ABSTRACT

A charge transfer device comprises an array of photodiodes, vertical registers having channels for receiving charge packets from the photodiodes and vertical electrodes for shifting the charge packets along the channels of the vertical registers. A horizontal register has channels for receiving the charge packets from the vertical registers and horizontal electrodes for successively shifting the charge packets across the channels of the horizontal register. An overflow barrier region extends across and is embedded below the channels of the horizontal register for establishing a barrier potential. An overflow drain region is connected to the channels of the horizontal register for discharging charge packets which exceed the barrier potential.

8 Claims, 6 Drawing Sheets

CCD IMAGE SENSOR WITH OVERFLOW BARRIER FOR DISCHARGING EXCESS ELECTRONS AT HIGH SPEED

BACKGROUND OF THE INVENTION

1. Field of the Invention

The present invention relates generally to two-dimensional CCD (charge-coupled device) imaging device, and more specifically to such a CCD device capable of efficiently discharging undesired charge packets. The present invention is particularly suitable for CCD image sensors where large amounts of non-usable charge packets must be quickly discharged.

2. Description of the Related Art

Japanese Laid-Open Patent Specification Sho 62-154881 discloses a two-dimensional charge transfer device comprising a plurality of vertical registers for receiving electrons, or "charge packets" from a two-dimensional array of photodiodes and shifting them down to a horizontal register. The horizontal register includes overflow barrier regions and an overflow drain region. When excessive charge packets are produced, they overflow the barrier regions and are discharged through the drain region to the outside, while useful charge packets are diverted to a utilization circuit. The overflow barrier regions of this prior art device are formed into the shape of narrow channels to take advantage of what is known as the narrow channel effect of a semiconductor junction on a threshold voltage, i.e., when the channel width is reduced, the threshold voltage of the junction increases. Due to the narrow channel effect, the overflow channel regions are at such a potential that only surplus electrons are discharged to the outside.

However, the narrow channel structure produces a throttling effect on charge packets. Therefore, the speed at which undesirable excess charge packets are discharged is not satisfactory for most applications.

Japanese Laid-Open Patent Specification Sho 63-254767 discloses a single-layer diffused overflow barrier region extending between the overflow drain region and the edges of horizontal-register channels remote from the vertical registers. However, the disadvantage of the prior art is that the forming of this barrier region requires an additional photoresist process.

SUMMARY OF THE INVENTION

It is therefore an object of the present invention to provide a CCD image sensor which can discharge undesirable electrons at high speed and which can be implemented without an additional photoresist process.

According to a first aspect, the present invention provides a charge transfer device comprising an array of photodiodes, a plurality of vertical registers having a plurality of channels for receiving charge packets from the photodiodes and a plurality of electrodes for shifting the charge packets along the channels, and a horizontal register having a plurality of channels for receiving the charge packets from the vertical registers and a plurality of electrodes for successively shifting the charge packets across the channels. An overflow barrier region is provided that extends across and is embedded below the channels of the horizontal register for establishing a barrier potential. An overflow drain region is connected to the channels of the horizontal register for discharging charge packets which exceed the barrier potential.

According to a second aspect, the present invention provides a charge transfer device comprising a first semiconductor region of first conductivity type on a substrate, an array of photodiodes on the first semiconductor region, a plurality of isolating channel regions of the first conductivity type embedded in the first semiconductor region for receiving charge packets from the photodiodes, a plurality of vertical-register channels of second conductivity type respectively on the channel regions, and a plurality of mutually overlapping vertical electrodes for shifting the charge packets along the vertical-register channels. A second semiconductor region of the first conductivity type is formed on the substrate, and an overflow barrier region of the first conductivity type is embedded in the second semiconductor region to a depth equal to the channel regions for establishing a barrier potential. A plurality of horizontal-register channels of second conductivity type are provided on the second semiconductor region respectively corresponding to the vertical-register channels to receive the charge packets therefrom, the horizontal-register channels overlying the overflow barrier region. A plurality of mutually overlapping horizontal electrodes are provided for shifting the charge packets across the horizontal-register channels. An overflow drain region of the second conductivity type is connected to the channels of the horizontal register for discharging charge packets which exceed the barrier potential established by the overflow barrier region.

BRIEF DESCRIPTION OF THE DRAWINGS

The present invention will be described in further detail with reference to the accompanying drawings, in which.

DETAILED DESCRIPTION

Figure 1A:
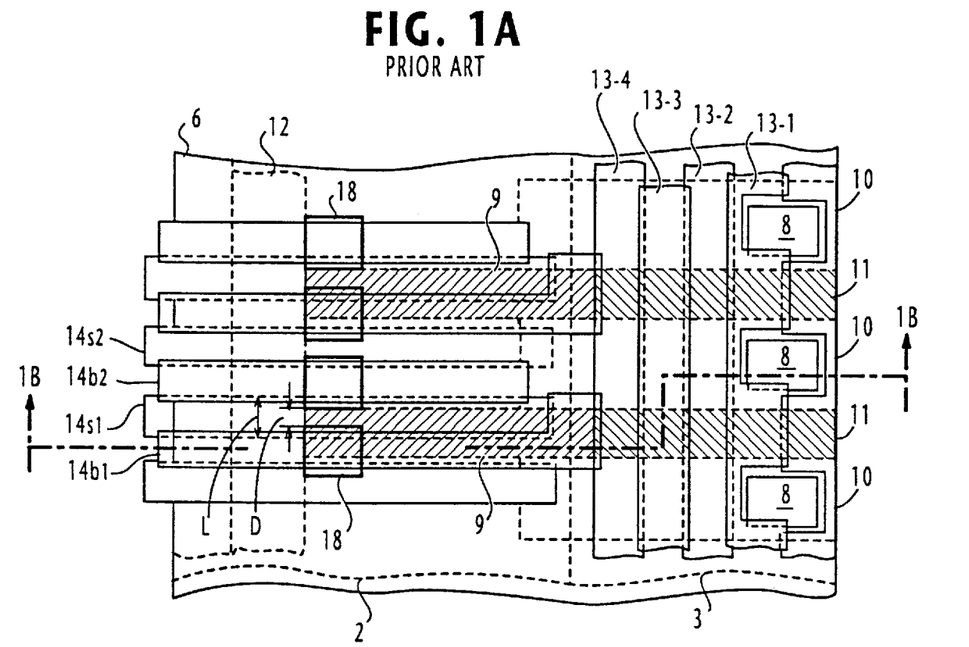
FIG. 1A is a partial plan view of a prior art CCD image sensor.
Figure 1B:
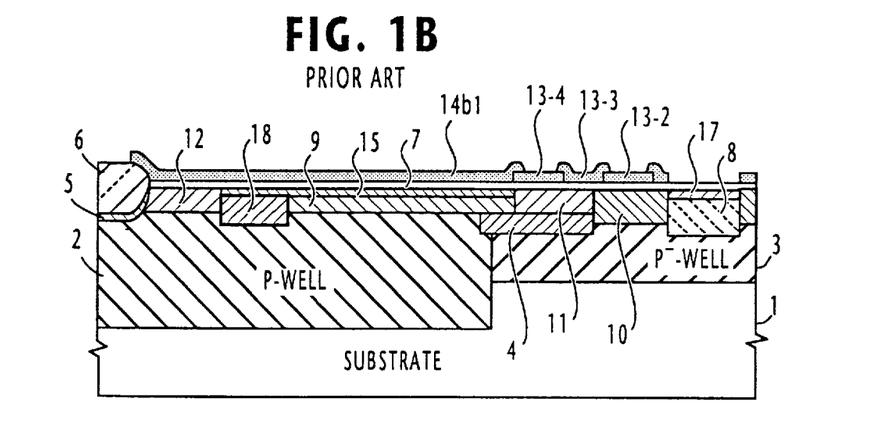
FIG. 1B is a cross-sectional view of the prior art CCD image sensor taken along the lines 1B of FIG. 1A.
Figure 2A:
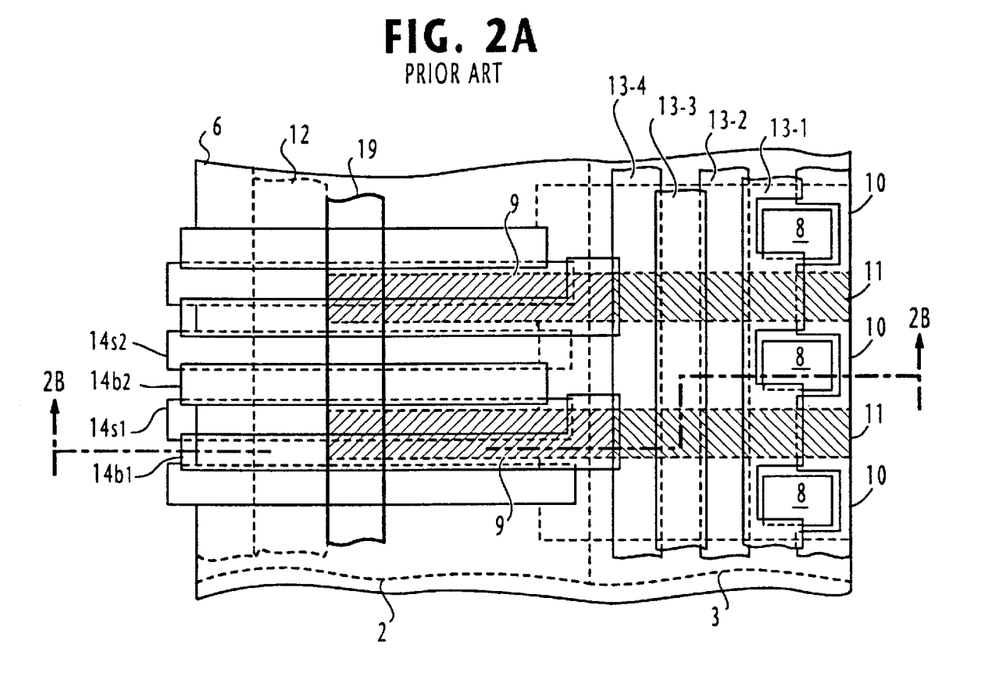
FIG. 2A is a partial plan view of another prior art CCD image sensor.
Figure 2B:
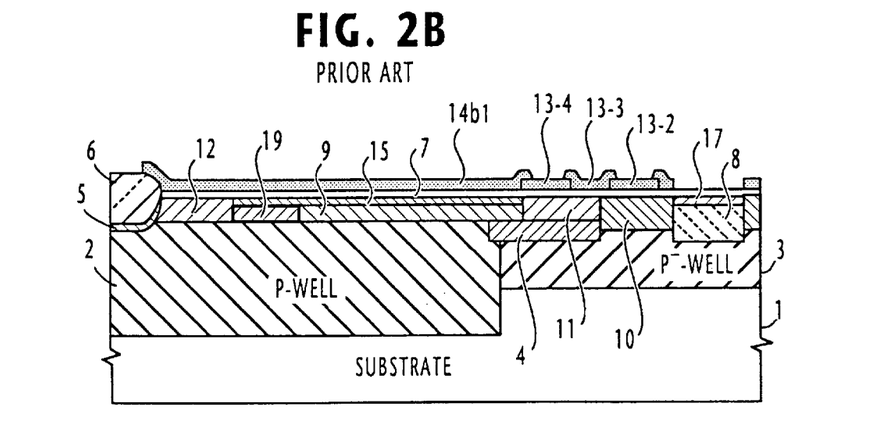
FIG. 2B is a cross-sectional view of the prior art CCD image sensor taken along the lines 2B of FIG. 2A.
Figure 3A:
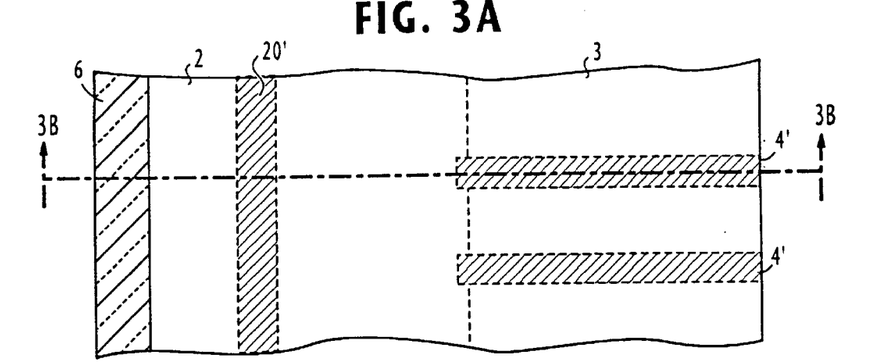
FIGS. 3A, 4A, 5A, 6A and 7A are partial plan views showing successive stages of fabricating a CCD image sensor of the present invention.
Figure 3B:
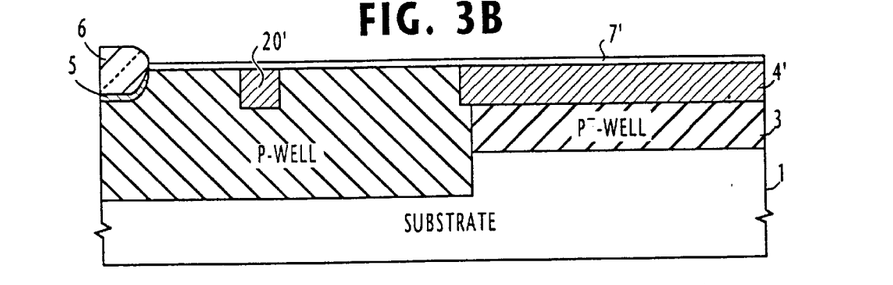
FIGS. 3B, 4B, 5B, 6B and 7B are cross-sectional views taken along the lines 3B, 4B, 5B, 6B and 7B of FIGS. 3A, 4A, 5A, 6A and 7A, respectively.

Before proceeding with the detailed description of the present invention, it may prove helpful to provide an explanation of a practical implementation of the prior art two-dimensional CCD image sensor with reference to FIGS. 1 and 2 as taught by Japanese Laid-Open Patent Specification Sho 62-154881.

A portion of the image area of the prior art CCD image sensor is generally represented as IA in which a two-dimensional array of photodiodes 8 are formed on a P⁻-type well 3 which is in turn formed on a substrate 1. A plurality of N-type semiconductor regions, or vertical-register channels 11, which are isolated from each other by channel stoppers 10, are formed on respective P-type insulating layers 4. The insulating layers 4 serve as isolators between the vertical-register channels 11 and the underlying P⁻-type well 3. A plurality of parallel, mutually overlapping vertical electrodes 13 extend across the vertical-register channels 11, forming a plurality of vertical resisters. Those vertical electrodes other than the final two electrodes are provided with openings for allowing light rays to impinge on the photodiodes 8.

Adjacent to the final two vertical electrodes is the horizontal register HR which is formed by a plurality of N-type regions 9 arranged in parallel in a direction normal to the vertical channels 11. These N-type regions 9 are formed on a P-type well 2 as extensions of vertical-register channels 11 to receive charge packets therefrom and to move them along a path on the horizontal register.

A plurality of P⁺-type overflow barrier regions 18 are diffused simultaneously with the P⁺-type channel stoppers 10 on the P-type well 2 adjacent the edges of N-type horizontal-register channels 9 remote from the image area. An N⁺-type diffused overflow drain region 12 is formed alongside the P⁺-type overflow barrier regions 18. A plurality of N⁻-type diffused thin isolating layers 15 are formed in parallel partially overlying the horizontal-register channels 9. A P⁺-type channel stopper 5 is formed alongside the overflow drain region 12. The device is coated with an insulator film 7 on which the vertical electrodes 13 of the vertical registers are provided, and a plurality of mutually overlapping electrodes 14 of the horizontal register HR are formed.

Overflow barrier regions 18 are mutually spaced a distance D which is narrower than the length L of the underlying storage electrodes 14s1, 14s2 as measured along the length of the horizontal register. This produces what is known as the narrow channel effect on the threshold voltage of a semiconductor device. As a result, the overflow barrier regions 19 produce a potential barrier to a certain amount of charge packets. Therefore, when a large amount of unuseful electrons must be discharged from the device, they exceed the barrier potential and spill over the overflow barrier regions 19 and are discharged through the drain region 12.

However, the disadvantage of this narrow spacing of barrier regions 19 is that they produce a throttling effect on charge packets as they are discharged through the overflow drain 12, resulting in a low discharging speed.

Japanese Laid-Open Patent Specification Sho 63-254767 discloses a single-layer overflow barrier region extending across edges of charge-transfer channels of the horizontal register. FIGS. 2A and 2B illustrate a practical implementation of a CCD image sensor according to the teaching is Specification. According to this prior art, a P⁺-type diffused layer 19 is formed as an overflow barrier between the overflow drain region 12 and the ends of horizontal channels 9 remote from the vertical registers. However, the disadvantage of the prior art is that the forming of this diffused region requires an additional photoresist process.

Referring now to FIGS. 3A to 7B, fabrication processes of the CCD image sensor of the present invention are illustrated. The device comprises an N-type silicon substrate 1 impurity-doped with a concentration of $2 \times 10^{14}$ cm⁻³. A P-type well 2 with a concentration of $3 \times 10^{15}$ cm⁻³ with a thickness of 6 microns is formed below the surface of substrate 1 outside of the image area by injecting boron and then the injected boron is diffused under pressure. A P⁻-type well 3 is formed within the image area immediately below the surface of substrate 1 to the depth of 2 microns by injecting boron ions and by pressure-diffusing the injected ions.

Boron ions are selectively injected to the depth of about 1 micron from the surface of P⁻-type well 3 and to the same depth from the surface of P-type well 2 and then pressure-diffused to form a plurality of P-type vertical channel portions 4' and a P-type overflow barrier portion 20'. As illustrated, the overflow barrier portion 20' extends in a direction normal to the length of vertical channel portions 4'. Channel stopper 5 and insulation film 6 are then formed along an edge of the device and then the upper surface of the device is coated with a silicon-dioxide thin film 7' (see FIGS. 3A,3B).

Figure 4A:
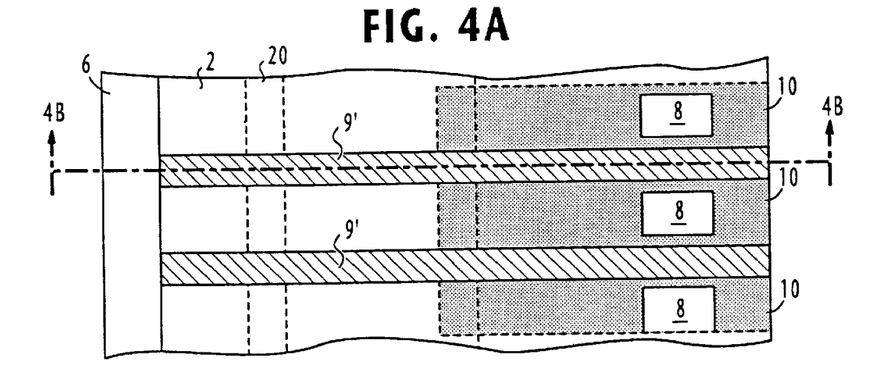
Figure 4B:
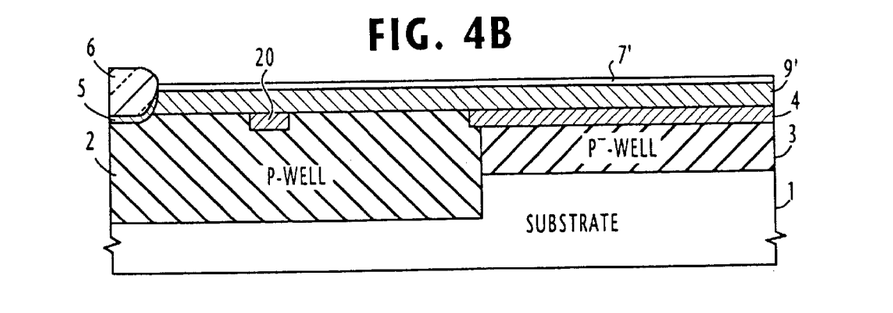

Through the silicon-dioxide film 7', phosphorus ions are selectively injected into those areas of P⁻-type well 3 which are disposed between the P⁻-type channel portions 4' and then diffused to form a matrix array of photodiodes 8. Next, phosphorus ions are injected into P-type vertical channel portions 4' to a depth approximately one half the thickness of portions 4' and into the portions of the P-type well 2 that extend from the channel portions 4 to the same depth so that a plurality of parallel N-type channel portions 9' are formed, leaving the remainder portions of the channel portions 4' as insulating layers 4 and leaving the remainder portion of the portion 20' as an overflow barrier region 20. The impurity concentration of overflow barrier region 20 is typically $2 \times 10^{16}$ cm⁻³ and its junction depth is 1.5 microns. Channel stoppers 10 are formed by injecting boron ions into areas outside the photodiodes 8 and channel portions 9' (FIGS. 4A, 4B).

Figure 5A:
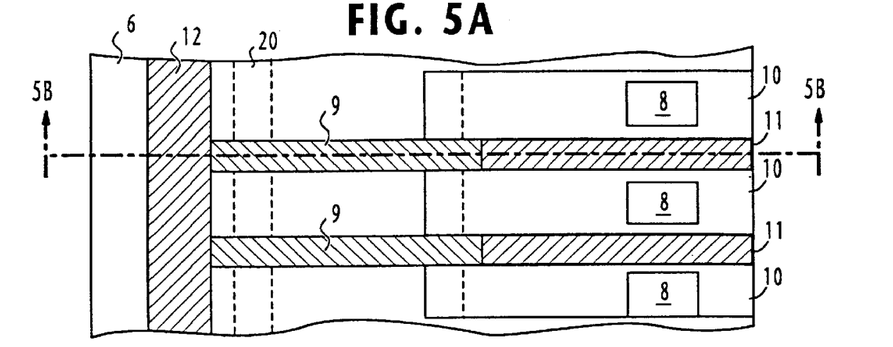
Figure 5B:
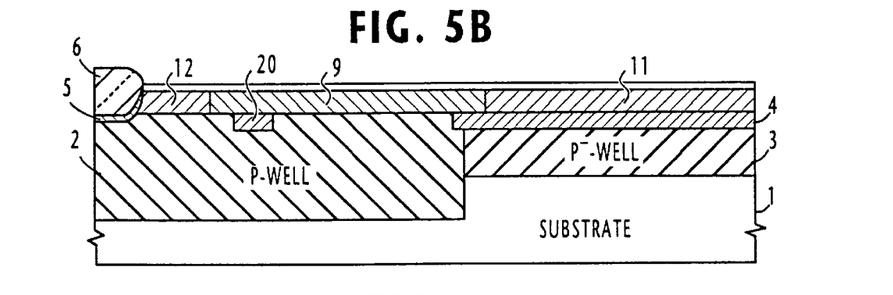

The N-type vertical transfer channels 11 are formed by injecting phosphorus ions into those portions of the N-type channel portions 9' that overlie the P-type vertical channels 4, leaving the remainder portions of the N-type portions 9' as horizontal-register channels 9. The impurity concentration of the channels 9 are typically $5 \times 10^{15}$ cm⁻³ and their junction depth is 0.5 microns. The N⁺-type diffused region 12 is then formed by doping phosphorus ions. The silicon-dioxide film 7' is removed and the device is subjected to thermal oxidation to form a silicon dioxide film 7 of thickness 50 to 10 nm (FIGS. 5A, 5B).

Figure 6A:
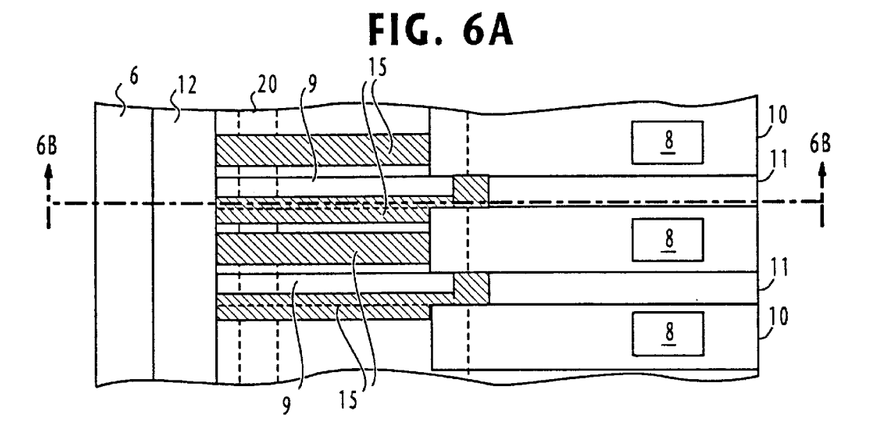
Figure 6B:
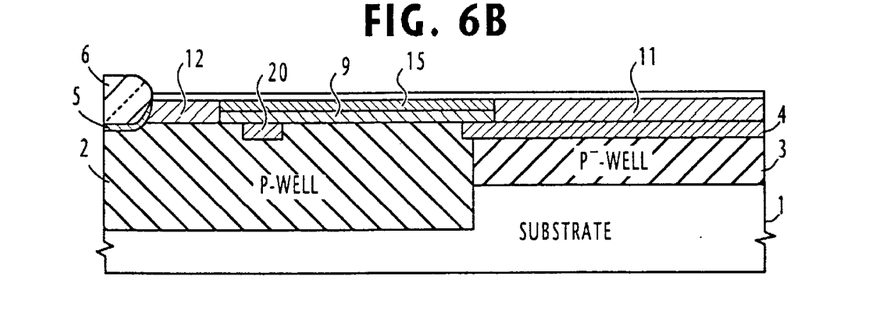

A polysilicon film is then deposited over the surface of the device to a thickness of 300 to 400 nm and the film is patterned to form vertical electrodes 13-2 and 13-4 and horizontal storage electrodes 14s1 and 14s2. Boron ions are injected to form a plurality of N⁻-type isolating layers 15 (FIGS. 6A, 6B). A silicon-dioxide film 16 of thickness 200 nm is deposited over the surface of the device and then a polysilicon layer of thickness 300 to 400 nm is formed on the film 16. The polysilicon layer is patterned to form a plurality of vertical electrodes 13-1 and 13-3 and a plurality of horizontal barrier electrodes 14b1 and 14b2. The photodiodes 8 are coated with a P⁺-type film 17 of thickness 0.2 microns by injecting boron ions (FIGS. 7A, 7B).

The vertical electrodes 13-1, 13-2, 13-3 and 13-4 are driven by four-phase clock pulses $\phi_{v1}$, $\phi_{V2}$, $\phi_{V3}$, $\phi_{V4}$, respectively, to shift charge packets along the vertical-register channels. The horizontal electrodes are divided into a plurality of sets of barrier electrodes 14b1, 14b2, and storage electrodes 14s1 and 14s2, with the barrier electrodes 14b1 and 14b2 overlying the underlying N⁻-type isolating layers 15. In each set, electrodes 14b1 and 14s1 form a first pair to be driven by horizontal clock pulses of first phase $\phi_{H1}$ and electrodes 14b2, 14s2 form a second pair to be driven by horizontal clock pulses of second phase $\phi_{H2}$.

In order to prevent the potential at the P$^+$-type overflow barrier region 20 from being adversely affected by the potential at the adjacent N$^+$-type overflow drain region 12, it is desirable that barrier region 20 be laterally offset from region 12 at least by a distance S, which is typically 3 microns.

Figure 7A:
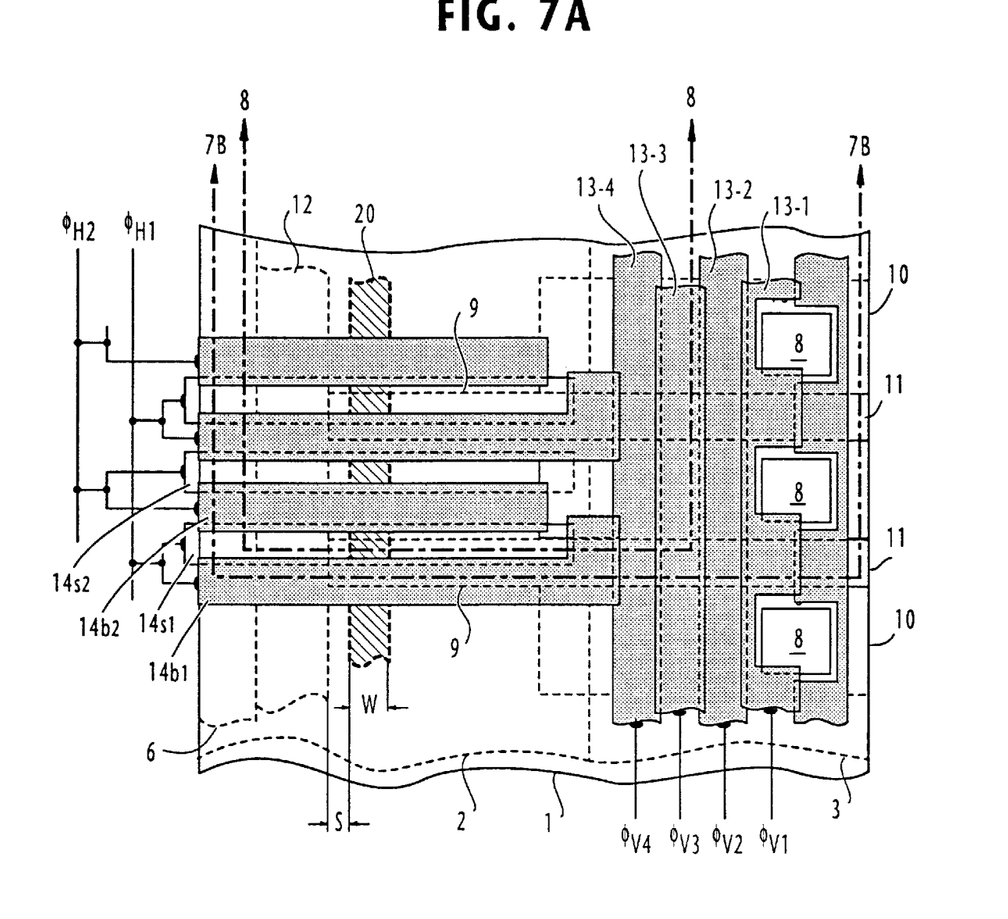
Figure 7B:
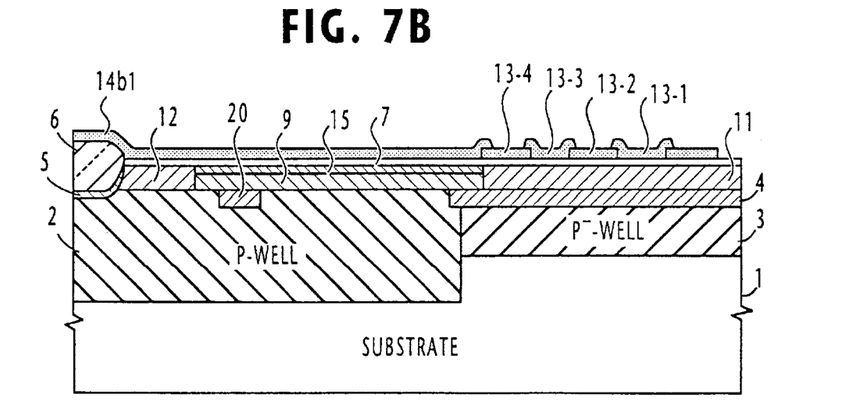

As illustrated in FIG. 7A, the horizontal barrier electrode 14b1 of each set of four horizontal electrodes has its input end patterned so that it is shaped like a hook. This hooked portion is disposed between the final vertical electrode 13-4 and the horizontal storage electrode 14s1 of the set and constitutes a vertical-to-horizontal transfer gate region which establishes a potential $V_C$ which is lower than the barrier potential $V_{OFB}$ established by the overflow barrier region 20.

Figures 8, 9, 10:
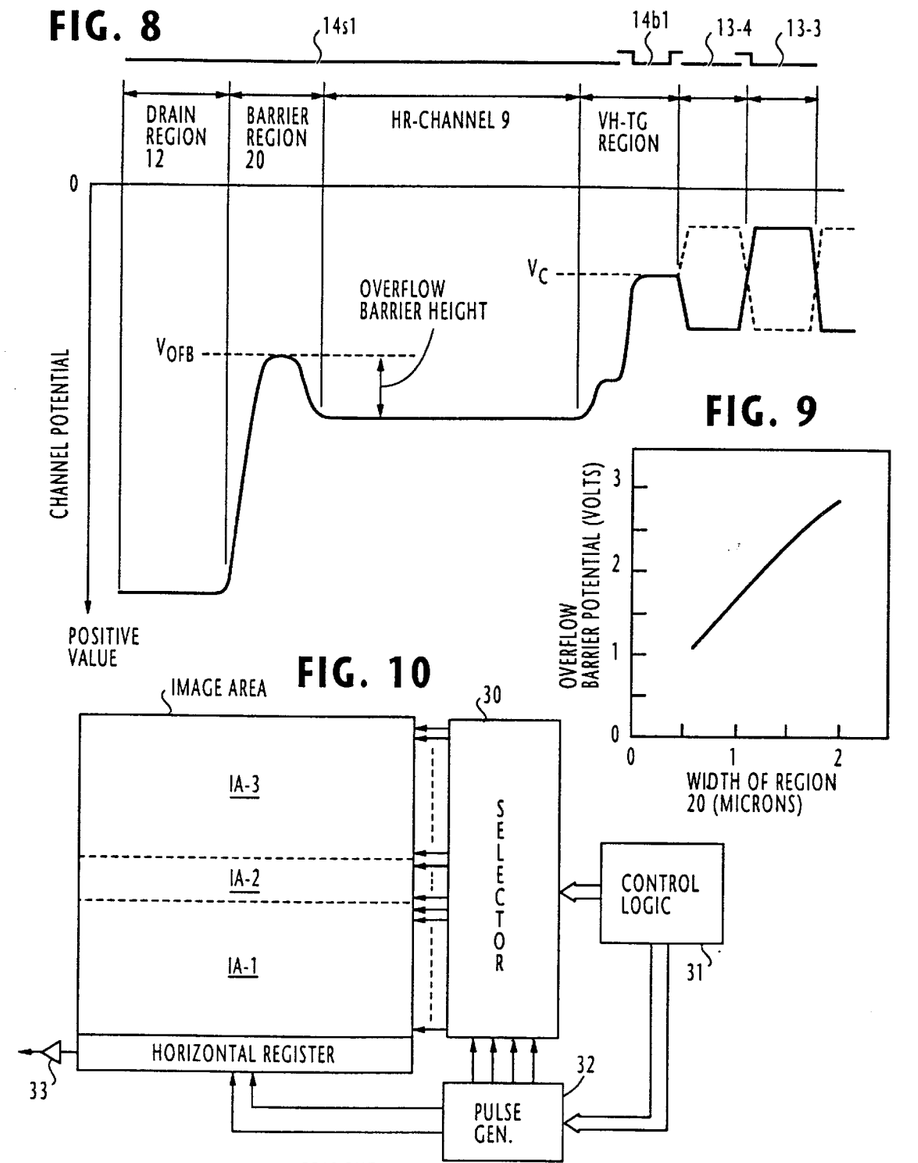
FIG. 8 is an illustration of a potential profile of the CCD image sensor of this invention taken along the line 8 of FIG. 7A.
FIG. 9 is a graphic representation of the relationship between the overflow barrier potential as a function of the width of the overflow barrier region of this invention.
FIG. 10 is a block diagram of the CCD image sensor and the circuitry for operating the sensor in an automatic focusing mode.

FIG. 8 shows a potential profile along a line drawn in FIG. 7A from vertical electrode 13-3 to the overflow drain region 12 intersecting a vertical-horizontal transfer gate region and a horizontal channel below the hooked portion of a horizontal barrier electrode 14b1 and a horizontal storage electrode 14s1.

It is found that, while no variations occurred in the barrier potential $V_{OFB}$ (FIG. 8) when the width W was varied in a range above 10 microns, a significant change was observed when the width was varied in a range below 3 microns. Specifically, the barrier potential increased (moved to the positive side) with a decrease in the width W in the range below 3 microns, lowering the height of barrier to charge packets.

FIG. 9 shows a computer simulation of the height (potential) of overflow barrier plotted as a function the width W provided that horizontal electrodes 14 are biased at 5 volts and the overflow drain region 12 is biased at 15 volts. FIG. 9 indicates that if the overflow barrier 20 has a width W of 1.7 microns, an overflow potential of 2.5 volts can be obtained.

When the charge transfer device is operated in an automatic focusing mode, the image area is divided into a lower wide region IA-1, an intermediate narrow region IA-2 and an upper wide region IA-3 as shown in FIG. 10. A gate selector 30 is connected to all the vertical transfer gates 13. Selector 30 selectively supplies a set of four-phase clock pulses from a pulse generator 32 in accordance with a control signal from a logic circuit 31. The horizontal register is driven by two-phase clock pulses from the pulse generator 32 under the control of the logic circuit.

Figure 11:
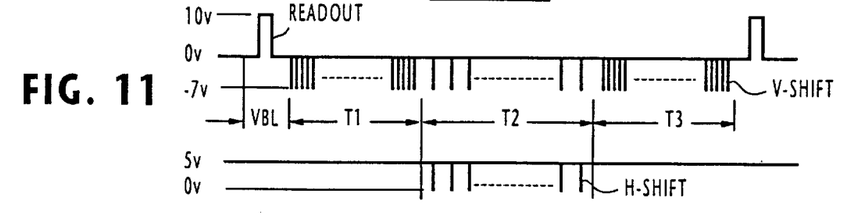
FIG. 11 is a timing diagram of the vertical and horizontal shift pulses supplied to the CCD image sensor during the automatic focusing mode.

As shown in FIG. 11, electrical charges, or charge packets, developed in the photodiodes 8 are instantly transferred to the corresponding vertical-register channels 11 in response to a high-voltage read-out pulse (typically 10 volts) supplied to the transfer gates that connect the photodiodes to the vertical-register channels. The electrodes 13 that correspond to the lower wide region IA-1 are selected during a period T1 and driven by high frequency four-phase transfer pulses, while all the horizontal electrodes are maintained at a high voltage (typically, 5 volts). As a result, charge packets stored in the region IA-1 are transferred at high speed to the overflow barrier region 20 and those exceeding the barrier potential spill over the region 20 and are discharged to the outside through the overflow drain region 12. During subsequent period T2, the vertical electrodes that correspond to the intermediate narrow region IA-2 as well as to the lower wide region IA-1 are selected and standard four-phase transfer pulses are supplied to the selected vertical electrodes, while the horizontal electrodes are driven by the normal two-phase, negative-going clock pulses. Charge packets in the intermediate region IA-2 are transferred to the horizontal register at normal speed. Being prevented from moving to the drain region 12 by the overflow barrier region 20, these charge packets are shifted through the horizontal register and delivered to an external focusing circuit through an amplifier 33. Finally, during a period T3, the selector 30 is controlled to select all the vertical electrodes and uses the same high frequency four-phase transfer pulses again as those used during period T1 and the horizontal electrodes are held at the high voltage. As a result, the remaining charge packets are shifted at high speed to the overflow barrier region 20, where those exceeding the barrier potential are discharged to the outside through the drain region 12.

Since the overflow barrier 20 is formed below and extends across the horizontal-register channels 9, overflowing charge packets can move unobstructed through the channels 9 to the overflow drain 12. In addition, since the overflow barrier 20 can be formed simultaneously with the insulating layers 4, no additional photoresist process is required.

As described in a paper "A ⅔-inch 2M-Pixel IT-CCD Image Sensor with Individual p-Wells for Separate V-CCD and H-CCD Formation", Michihiro Morimoto et al, IEEE International Solid-State Circuits Conference Digest of Technical Papers, Vol. 37, February 1994, pages 222–223, the charge transfer capability of the vertical registers and the transfer efficiency of the horizontal register can be improved by individually optimizing the structures of the vertical registers and horizontal register.

It is therefore preferable that the P-type well 3 has a higher impurity concentration and a smaller thickness than those of the P-type well 2, and that the vertical-register channels 11 have a higher impurity concentration than that of the horizontal-register channels 9. In addition, the thicknesses of wells 2 and 3 are such that no depletion can occur even if a voltage as high as 30 volts is applied to the substrate. With the above described structure, the amount of charge packets that can be transferred through the vertical registers can be increased and the horizontal register has an increased fringe electric field that results in an increase in transfer efficiency.

What is claimed is:

1. A charge coupled device image sensor comprising:
    an array of photodiodes;
    a plurality of vertical registers having a plurality of channels for receiving charge packets from said photodiodes and a plurality of electrodes for shifting the charge packets along the channels;
    a horizontal register having a plurality of channels for receiving the charge packets from the vertical registers and a plurality of electrodes for successively shifting the charge packets across the channels;
    an overflow barrier region extending across and embedded below the channels of the horizontal register for establishing a barrier potential; and
    an overflow drain region connected to the channels of the horizontal register for discharging charge packets which exceed said barrier potential.

2. A charge coupled device image sensor as claimed in claim 1, wherein the electrodes of the vertical registers are divided into first, second and third groups, further comprising:
    means for driving the electrodes of the first group at a high frequency for shifting charge packets from a first portion of the photodiode array to the horizontal register and maintaining the electrodes of the horizontal register at a constant potential for discharging the charge packets through said overflow drain region, driving the electrodes of the first and second groups at a low frequency for shifting charge packets from a second portion of the photodiode array to the horizontal register and driving the electrodes of the horizontal register for shifting the charge packets therethrough, and driving the electrodes of the first, second and third groups at said high frequency for shifting charge packets from a third portion of the photodiode array to the horizontal register and maintaining the electrodes of the horizontal register at said constant potential for discharging the charge packets through said overflow drain region.

3. A charge coupled device image sensor comprising:
   a first semiconductor region of first conductivity type on a substrate;
   an array of photodiodes on said first semiconductor region;
   a plurality of isolating channel regions of the first conductivity type embedded in the first semiconductor regionfor receiving charge packets from the photodiodes;
   a plurality of vertical-register channels of second conductivity type respectively on said channel regions;
   a plurality of mutually overlapping electrodes for shifting the charge packets along the vertical-register channels;
   a second semiconductor region of the first conductivity type on said substrate;
   an overflow barrier region of the first conductivity type embedded in said second semiconductor region to a depth equal to said channel regions for establishing a barrier potential;
   a plurality of horizontal-register channels of second conductivity type on said second semiconductor region respectively corresponding to said vertical-register channels to receive the charge packets therefrom, the horizontal-register channels overlying the overflow barrier region;
   a plurality of mutually overlapping electrodes for shifting the charge packets across the horizontal-register channels; and
   an overflow drain region of the second conductivity type connected to the channels of the horizontal register for discharging charge packets which exceed the barrier potential established by the overflow barrier region.

4. A charge coupled device image sensor as claimed in claim 3, wherein said first semiconductor region has a higher impurity concentration than the second semiconductor region.

5. A charge coupled device image sensor as claimed in claim 4, wherein said first semiconductor region has a smaller thickness than the second semiconductor region.

6. A charge coupled device image sensor as claimed in claim 3, wherein said vertical-register channels have a higher impurity concentration than the channels of the horizontal register.

7. A charge coupled device image sensor as claimed in claim 3, wherein the electrodes of the vertical registers are divided into first, second and third groups, further comprising:
   means for driving the electrodes of the first group at a high frequency for shifting charge packets from a first portion of the photodiode array to the horizontal register and maintaining the electrodes of the horizontal register at a constant potential for discharging the charge packets through said overflow drain region, driving the electrodes of the first and second groups at a low frequency for shifting charge packets from a second portion of the photodiode array to the horizontal register and driving the electrodes of the horizontal register for shifting the charge packets therethrough, and driving the electrodes of the first, second and third groups at said high frequency for shifting charge packets from a third portion of the photodiode array to the horizontal register and maintaining the electrodes of the horizontal register at said constant potential for discharging the charge packets through said overflow drain region.

8. A method for fabricating a charge coupled device image sensor comprising the steps of:
   forming a first semiconductor region of first conductivity type on a substrate and forming a second semiconductor region of the first conductivity type on the substrate adjacent the first semiconductor region;
   forming a plurality of channel regions of the first conductivity type on the first semiconductor region and an overflow barrier region of the first conductivity type on the second semiconductor region;
   forming a plurality of vertical-register channels respectively on said channel regions and a plurality of horizontal-register channels on the second semiconductor region respectively extending from the vertical-register channels and overlying the overflow barrier region;
   forming an overflow drain region of the second conductivity type on the second semiconductor region adjacent the horizontal-register channels; and
   forming a plurality of mutually overlapping electrodes on said vertical-register channels and a plurality of mutually overlapping electrodes on said horizontal-register channels.

* * * * *